United States Patent [19]
Jaussaud et al.

[11] Patent Number: 6,113,692
[45] Date of Patent: Sep. 5, 2000

[54] APPARATUS AND PROCESS FOR THE FORMATION OF MONOCRYSTALLINE SILICON CARBIDE (SIC) ON A NUCLEUS

[75] Inventors: Claude Jaussaud, Meulan; Roland Madard, Eybens; Mikhail Anikin, Echirolles; Isabelle Garcon, Toulouse, all of France

[73] Assignee: Commissariat a l'Energie Atomique, Paris, France

[21] Appl. No.: 08/824,093

[22] Filed: Mar. 25, 1997

[30] Foreign Application Priority Data

Apr. 10, 1996 [FR] France .................................. 96 04450

[51] Int. Cl.⁷ .................................................. C30B 23/06
[52] U.S. Cl. ............................ 117/105; 117/109; 117/952
[58] Field of Search ...................... 117/105, 109, 117/952

[56] References Cited

U.S. PATENT DOCUMENTS

| | | | |
|---|---|---|---|
| 3,615,930 | 10/1971 | Knippenberg et al. | 117/951 |
| 3,634,149 | 1/1972 | Knippenberg et al. | 117/951 |
| 3,813,340 | 5/1974 | Knippenberg et al. | 117/951 |
| 4,556,436 | 12/1985 | Addamiano | 117/951 |
| 5,349,207 | 9/1994 | Malhi | |
| 5,863,325 | 1/1999 | Kanemoto et al. | 117/951 |

FOREIGN PATENT DOCUMENTS

WO 89/04055  5/1989  WIPO .
WO 94/23096  10/1994  WIPO .

OTHER PUBLICATIONS

Patent Abstracts of Japan, vol. 18, No. 140 (C–1177), Mar. 8, 1994, JP–05–319998, Dec. 3, 1993.
Patent Abstracts of Japan, vol. 17, No. 367, Jul. 12, 1993, JP–05–058774, Mar. 9, 1993.
E–MRS 1994 Spring Meeting, May 24–27, 1994, Isabelle Garcon, et al., "Study of SiC Single Sublimation Growth Conditions".

*Primary Examiner*—Robert Kunemund
*Attorney, Agent, or Firm*—Oblon, Spivak, McClelland, Maier & Neustadt, P.C.

[57] ABSTRACT

The invention relates to an apparatus for forming SiC on a nucleus. The apparatus comprises a first enclosure (100) defined by at least one wall (102, 110, 112) and able to receive a SiC nucleus (122), a SiC powder reservoir (118) and means (120) for heating the enclosure and, according to the invention, the wall (102, 110, 112) is essentially covered by at least one SiC layer (116).

6 Claims, 2 Drawing Sheets

APPARATUS AND PROCESS FOR THE FORMATION OF MONOCRYSTALLINE SILICON CARBIDE (SIC) ON A NUCLEUS

DESCRIPTION

1. Technical Field

The present invention relates to an apparatus and a process for forming monocrystalline silicon carbide on a nucleus. Throughout the remainder of the text, the silicon carbide is symbolically designated by SiC.

The invention more particularly applies to the production of monocrystalline silicon carbide ingots of a given polytype. These ingots are used for the production of substrates usable in micro-electronics.

2. Prior Art

Document (1), whose reference is given at the end of the present description, illustrates the use of silicon carbide wafers in micro-electronics. For such a use, the silicon carbide must have a good crystal quality.

A known process for the production of silicon carbide of an electronics quality is based on the sublimation of a SiC powder, which is condensed on a monocrystalline SiC nucleus.

FIG. 1 shows for illustration purposes an apparatus used for performing this sublimation process. The apparatus comprises a graphite crucible 10 with a generally cylindrical side wall 11 and covered by a cover 12. The crucible 10 and cover 12 define a sublimation enclosure 14, on whose bottom is placed a nucleus 16 from which it is wished to form a silicon carbide ingot.

The cylindrical wall 11 of the crucible includes in its upper part a chamber 18 forming a SiC powder reservoir. A thin or fine graphite partition 20 separates the chamber 18 from the sublimation enclosure 14.

The crucible 10 is placed in a furnace, not shown in FIG. 1, which heats the silicon carbide powder in the chamber 18 and the nucleus 16. The SiC powder and nucleus are respectively heated to temperatures $T_1$ and $T_2$, such that $T_1$ exceeds $T_2$.

The silicon carbide of the chamber 18 sublimates under the action of heat, traverses the partition 20 and is deposited in the enclosure 14, particularly on the nucleus 16.

An apparatus according to FIG. 1 is described in document (2), whose reference is also given at the end of the description. According to said document, the choice of graphite for producing the crucible is desirable to the extent that it makes it possible to form a carbon source during the growth of the ingot on the nucleus.

It would appear that the sublimation of the silicon carbide is not congruent. The vapour from the silicon carbide powder in the chamber 18 does not consist solely of SiC, but instead a mixture of SiC, $SiC_2$, $Si_2C$, Si, $Si_2$, $Si_3$, $C_2$ and $C_3$. Moreover, it is found that globally a larger silicon than carbon quantity evaporates from the powder. However, other phenomena, such as phenomena of silicon migration into the graphite walls, lead to a silicon depletion of the vapours present in the enclosure.

In the case of the apparatus of FIG. 1, the silicon contained in the vapours produced by the sublimation of the SiC powder of the chamber 18 tends to migrate into the thick crucible wall 11, particularly below the chamber 18.

This silicon loss gives rise to a graphitization of the SiC ingots produced. However, carbon precipitation in graphite state in ingots leads to a poor crystal quality and to a blockage of crystal growth, which is prejudicial to the production of substrates for microelectronic applications.

One measure for preventing the graphitization phenomenon consists of using a source powder (in chamber 18) containing both SiC and silicon. This silicon enrichment of the source avoids the graphitization at the start of SiC ingot growth. Reference can be made in this connection to document (3), whose reference is given at the end of the description.

However, silicon addition does not make it possible to maintain a constant vapour composition throughout the ingot growth and therefore completely prevent graphitization, which is in fact only delayed.

Thus, one object of the invention is to propose an apparatus for the formation of silicon carbide on a nucleus and in particular for the formation of a SiC ingot, which does not suffer from the limitations referred to hereinbefore.

The invention also aims at obtaining a growth of a SiC ingot having a good crystal quality, whilst preventing the graphitization phenomenon.

A further aim of the invention is to propose a process for the formation of a SIC ingot with said apparatus.

DESCRIPTION OF THE INVENTION

In order to achieve these aims, the invention more specifically relates to an apparatus for the formation of SiC on a nucleus comprising a first enclosure forming a crucible, defined by at least one wall and able to receive a SiC nucleus, a SiC powder reservoir forming a main SiC source, means for heating the enclosure able to establish a first temperature gradient between the SiC source and the SiC nucleus.

According to the invention, the wall or walls of the first enclosure are essentially covered by at least one silicon carbide layer. It is considered that the wall is essentially covered by the SiC layer, either when the layer covers the entire surface of said wall, or when it covers a major part of the surface of the wall.

During SiC formation on the nucleus, at least part of the silicon carbide layer covering the wall behaves like an additional SiC source and makes it possible to compensate the migration into the wall of the silicon from the main source.

This effect can be reinforced by also establishing a temperature difference between the silicon carbide layer of the wall and the nucleus. In addition, according to an advantageous aspect of the invention, it is possible to equip the apparatus with heating means able to establish a second temperature gradient between the SiC layer covering the wall and the SiC nucleus. The first temperature gradient between the main SiC source and the nucleus and the second temperature gradient between the SiC layer on the wall and the nucleus have the same sign. The SiC layer on the wall then at least partly behaves like an additional source. As for the main source, the silicon carbide essentially covering the wall can be in powder form.

In a special embodiment of the apparatus, the enclosure can be defined by a cylindrical side wall, a bottom and a cover. The complete cylindrical side wall is covered on its outer face by an e.g. SiC powder layer. Moreover, as described hereinafter, during SiC growth on the nucleus, a SiC layer also forms on the inner face of the cylindrical side wall. Said layer then also constitutes an additional SiC source with respect to the nucleus.

Advantageously, a lower portion of the side wall and the bottom of the enclosure can form the SiC powder reservoir constituting the main source. Thus, the main source is directly placed in the sublimation enclosure. The silicon carbide nucleus, also placed in the sublimation enclosure, can be fixed to a support of the cover.

Said support is preferably designed so as to form a protuberance from the cover, turned towards the enclosure bottom, i.e. towards the silicon carbide main source.

Thus, during the growth of a monocrystalline SiC ingot on the nucleus, polycrystalline silicon carbide also forms on the enclosure wall and on the cover. By having a nucleus support projecting with respect to the cover, it is ensured that the polycrystalline silicon carbide forming on the cover around the nucleus and whose growth is faster than that of the monocrystalline SiC, does not cover the ingot being formed.

During the formation of the ingot, the silicon carbide deposited on the wall or walls and on the cover hermetically seals the cover on the wall. Moreover, so as not to destroy the enclosure at the time of its opening, at the end of the ingot growth operation, a sacrificial ring can be placed between the walls and the cover. The said ring undergoes sawing in order to open the enclosure and is replaced for each new growth operation. Thus, the enclosure forming the crucible can be used several times.

The invention also relates to a process for forming a silicon carbide ingot in an apparatus such as has been described hereinbefore.

The process essentially comprises the following successive stages:
a) placing a SiC nucleus in the first enclosure,
b) vacuumizing the first enclosure,
c) cleaning the nucleus,
d) growth of monocrystalline SiC on the nucleus.

During stage c) the nucleus is cleaned in order to improve its surface state. The nucleus temperature Tg is then instantaneously maintained above the temperature Ts of the main source and the temperature Tc of the SiC layer covering the enclosure wall. The nucleus then behaves like a source and a sublimation occurs from the nucleus. This sublimation has the effect of polishing the nucleus surface.

During stage d), the main source temperature Ts is kept above the temperature Tc of the SiC layer covering the enclosure wall. This layer, forming an additional source, is itself kept at a temperature above the nucleus temperature Tg.

Thus, the gradient between the source and the nucleus and the gradient between the SiC layer and the nucleus still have the same sign, but said sign changes between stage c) (negative gradient) and stage d) (positive gradient).

Other features and advantages of the invention can be gathered from the following description given in a purely illustrative and non-limitative manner with respect to the attached drawings.

DETAILED DESCRIPTION OF EMBODIMENTS OF THE INVENTION

Figure 1:
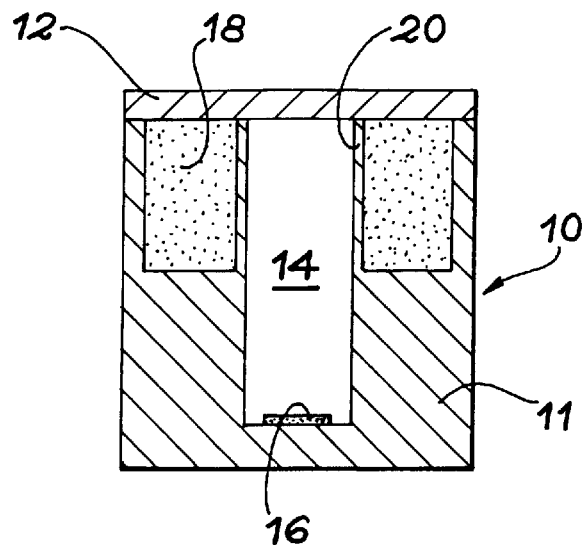
FIG. 1, already described, is a diagrammatic section of a known apparatus for forming SiC on a nucleus.
Figure 2:
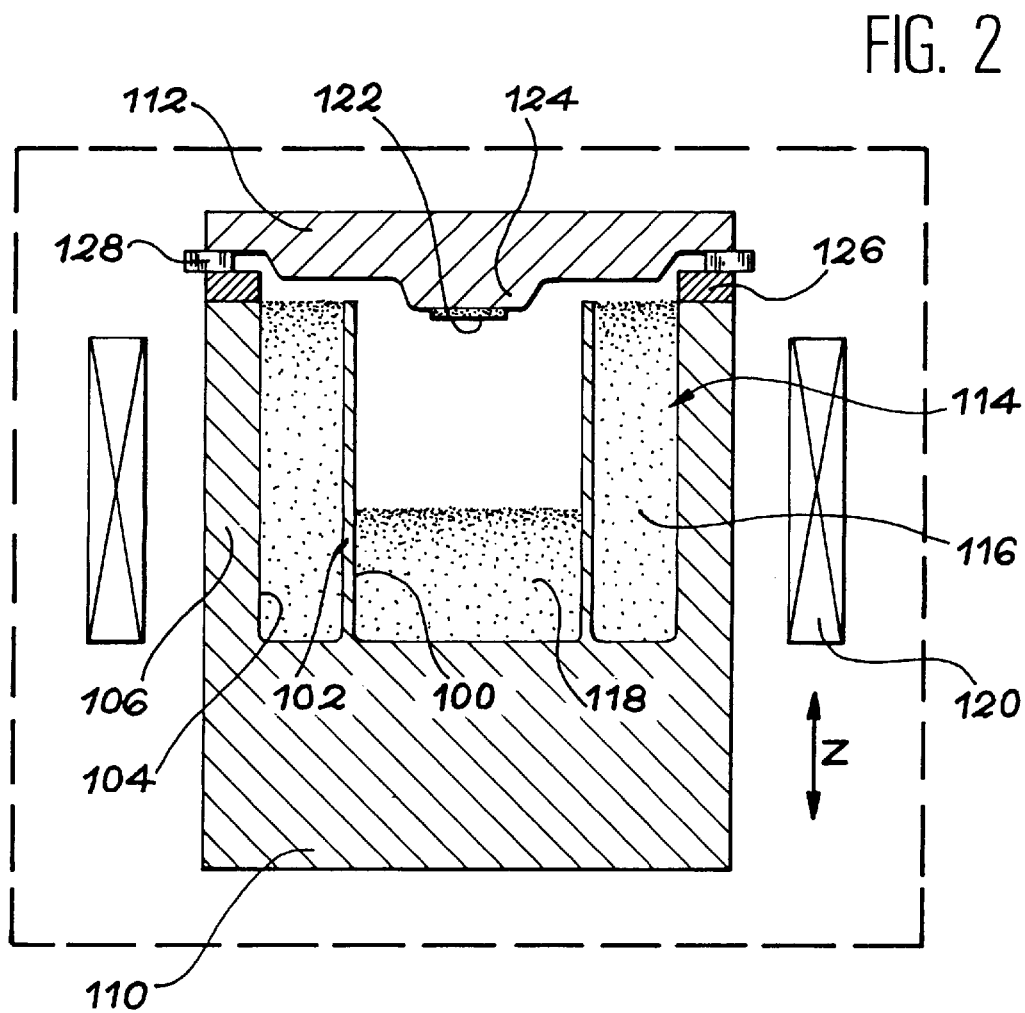
FIG. 2 is a diagrammatic section of an embodiment of the apparatus according to the invention during a vacuumizing stage.

The apparatus according to the invention shown in FIG. 2 a crucible having a first enclosure 100, laterally defined by a first cylindrical interior sidewall 102 and a second cylindrical exterior sidewall 106, which encloses a second concentric enclosure 104.

The enclosures 100 and 104 have a thick bottom 110, which essentially has a thermal inertia function, as well as a cover 112 covering the top part of the enclosures.

The second cylindrical exterior wall 106 of the second enclosure surrounds the first cylindrical wall 102 of the first enclosure thereby forming a circular clearance 114 between these walls. The circular clearance 114 is essentially filled with silicon carbide powder. This powder forms a SiC layer 116 covering the wall 102 of the first enclosure in the sense of the invention.

The lower part of the cylindrical wall 102 and the bottom 110 form a reservoir 118, which is also filled with SiC powder. This reservoir constitutes the main SiC source for forming the ingot.

The assembly formed by the side walls, the bottom and the cover is preferably made from graphite. This material is compatible with the constraints imposed by the silicon carbide sublimation conditions. A graphite crucible is able to withstand high temperatures (2500° C.) and is able to resist atmospheric pressure.

Moreover, graphite remains in thermodynamic equilibrium with SiC.

This property avoids any reaction with the SiC and consequently prevents deterioration to the apparatus. Finally, the graphite is not a silicon carbide dopant and can be obtained with a high purity.

Other materials such as TiC, HfC, TaC and MoC can also be envisaged for producing the apparatus. However, they are more expensive and more fragile with respect to thermal shocks.

One or more electrically conductive turns form induction heating means 120 for the crucible. The turn or turns can be vertically displaced along the side walls in direction Z shown in the drawing, in order to heat in variable manner different parts of the apparatus.

Initially a SiC nucleus 122 is attached, e.g. with sugar, on a protuberance 124 of the cover 112. Then, after placing a graphite ring 126 at the top of the wall 106 of the second enclosure 104, the nucleus-equipped cover is placed above the crucible. The nucleus then faces the SiC powder of the reservoir 118.

One or more silicon shims 128 are placed between the graphite ring 126 and the edge of the cover. These shims ensure that the cover does not rest tightly on the ring and consequently does not seal the crucible.

A pumping carried out in an enclosure surrounding the apparatus thus vacuumizes the crucible reducing the pressure therein to approximately 1 to 20 Torr (130 to 2600 Pa) in exemplified manner. This enclosure is represented in the drawing by a single broken line surrounding the apparatus.

When an adequate vacuum has been obtained, the heating means 120 are energized in order to increase the crucible temperature. When the temperature reaches or exceeds 1410° C. the silicon shims 128 melt and the cover bears on the ring 126, as shown in FIG. 2.

As stated hereinbefore, in order to clean its surface, the nucleus is firstly heated to a temperature above that of the SiC powder in the clearance 114 and in the reservoir 118. The turn then occupies a high position.

Secondly, the turn is lowered in order to further heat the bottom of the crucible. The first and second sources are then raised to a temperature higher than that of the nucleus.

The temperature of the SiC powder in the reservoir is e.g. chosen in a range 2200 to 2350° C., whilst the nucleus temperature is chosen between 2000 and 2240° C.

When the temperatures of the SiC sources, i.e. the powder in the reservoir 118 and the powder in the clearance 114 are kept above the nucleus temperature, the silicon carbide sublimates from the sources and condenses in monocrystalline form on the nucleus. As a function of the nucleus quality, it is thus possible to form an ingot with one or more polytypes.

As a result of the characteristics of the invention, it is possible to prevent or compensate a migration into the walls of the crucible of silicon resulting from the sublimation of the main source, i.e. the powder of the reservoir 118.

Thus, the SiC powder layer covering the side walls also behaves as a SiC source. The SiC vapours of said source pass through the porous side wall 102 and limit the migration of silicon into said walls. Gradually the porous side wall becomes clogged with silicon carbide and then itself behaves like a SiC source.

It should also be noted that the SiC vapours from the sources, also condense on the inner surface of the walls of the first enclosure, essentially in the form of polycrystalline SiC.

Figure 3:
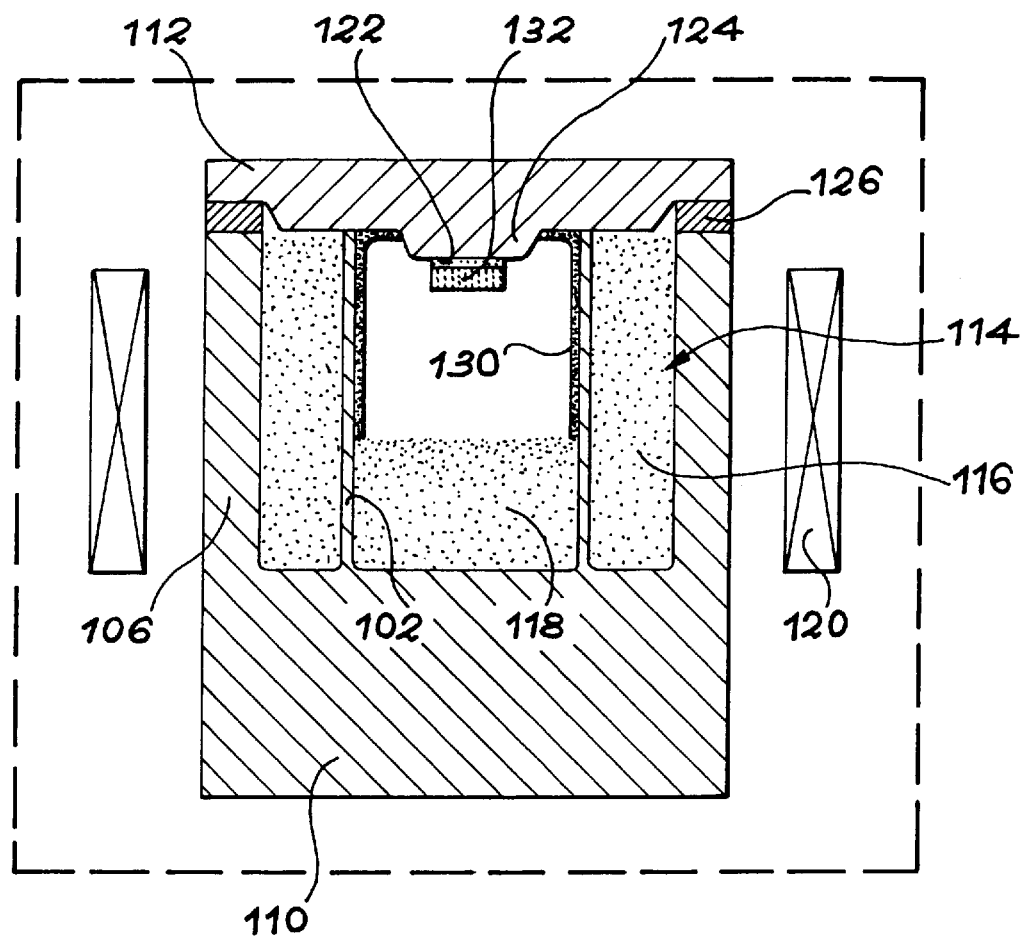
FIG. 3 is a diagrammatic section of the apparatus of FIG. 2 during a silicon carbide ingot formation stage.

Thus, during the SiC ingot formation process, the complete enclosure wall is internally covered by a second SiC layer, designated 130 in FIG. 3. The side walls are consequently covered with the inner SiC layer 130 formed by condensation and the outer layer constituted by the SiC powder.

As shown in FIG. 3, the polycrystalline SiC layer 130 also covers the cover 112 and hermetically seals it on the side walls.

The layer 130 has two functions. This layer on the one hand makes it possible to form around the nucleus an environment solely constituted by SiC and also behaves as a SiC source with respect to the nucleus, which contributes to the crystal quality of the ingot formed. On the other hand, the layer 130 renders the crucible walls tight and prevents any migration of silicon resulting from the sublimation of the SiC of the main source.

The ingot formed on the nucleus is designated by the reference 132. The time taken for its growth can e.g. range between 30 minutes and several hours. The crucible is then cooled and the ring 126 is cut away in order to open the enclosure and recover the ingot 132 on the cover.

DOCUMENTS CITED IN THE DESCRIPTION (1) U.S. Pat. No. 5,349,207
(2) U.S. Pat. No. 4,866,005
(3) Study of SiC Single Crystal Sublimation Growth Conditions by I. Garcon et al., E-MRS 1994, Spring meeting, Strasbourg, France Symposium E, High Temperature Electronics, pp 1–8.

What is claimed is:

1. A process for forming an SiC ingot in an apparatus comprising a crucible having;

a first enclosure defined by a bottom, a cover and at least one interior sidewall and in which a SiC nucleus is positioned, each of the three crucible components being formed from a material selected from the group consisting of graphite, TiC, HfC, TaC and MoC; a SiC powder reservoir located within the first enclosure which provides a first SiC source; a second exterior sidewall, said first interior wall and said second exterior wall defining a clearance which is filled with SiC as a second SiC source; and a means for establishing at least one temperature gradient between the SiC nucleus and the first and second SiC sources, the process, comprising:

a) placing said SiC nucleus in said first enclosure;
b) forming a vacuum within said first enclosure;
c) cleaning said nucleus; and
d) growing a body of SiC on said nucleus.

2. The process of claim 1, wherein during the cleaning (c) of said nucleus the temperatures $T_g$, $T_s$ and $T_c$ respectively of the nucleus, the SiC material within said first enclosure and the SiC material within said clearance such that $T_g > T_s$ and $T_g > T_c$.

3. The process of claim 1, wherein during the growth of SiC on said nucleus, temperatures $T_g$, $T_s$ and $T_c$ respectively of said nucleus, the SiC material within said first enclosure and the SiC material within said clearance are such that $T_s > T_c > T_g$.

4. The process of claim 1, wherein, prior to the formation of the vacuum within the first enclosure, at least one silicon shim is placed at the top of said exterior side wall and under the cover of the crucible, and, subsequent to vacuum formation, the silicon shim is melted which seals the cover to said sidewall.

5. The process of claim 1, wherein during the growth of SiC on said nucleus, the temperature of said nucleus ranges from 2,000 to 2240° C. and the temperature of the SiC powder in said reservoir ranges from 2200 to 2350° C.

6. A process for forming an SiC ingot in an apparatus comprising a crucible having;

a first enclosure defined by a bottom, a cover and at least one interior sidewall and in which a SiC nucleus is positioned, each of the three crucible components being formed from a material selected from the group consisting of graphite, TiC, HfC, TaC and MoC; a SiC powder reservoir located within the first enclosure which provides a first SiC source; a second exterior sidewall, said first interior wall and said second exterior wall defining a clearance which is filled with SiC as a second SiC source; and a means for establishing at least one temperature gradient between the SiC nucleus and the first and second SiC sources, the process, comprising:

a) placing said SiC nucleus in said first enclosure;
b) forming a vacuum within said first enclosure;
c) cleaning said nucleus by establishing the temperature relationships $T_g > T_s$ and $T_g > T_c$, wherein temperatures $T_g$, $T_s$ and $T_c$ respectively are of the nucleus, the SiC material within said first enclosure and the SiC material within said clearance; and
d) growing a body of SiC on said nucleus by establishing the temperature relationships: $T_s > T_c > T_g$, wherein $T_g$, $T_s$ and $T_c$ are as defined above.

* * * * *